United States Patent
Barnes et al.

(10) Patent No.: US 9,952,263 B2
(45) Date of Patent: *Apr. 24, 2018

(54) METHOD AND APPARATUS FOR GRID IMPEDANCE DETECTION

(71) Applicant: Enphase Energy, Inc., Petaluma, CA (US)

(72) Inventors: Andrew Barnes, Santa Rosa, CA (US); Brian Acker, Sebastopol, CA (US)

(73) Assignee: Enphase Energy, Inc., Petaluma, CA (US)

( * ) Notice: Subject to any disclaimer, the term of this patent is extended or adjusted under 35 U.S.C. 154(b) by 532 days.

This patent is subject to a terminal disclaimer.

(21) Appl. No.: 14/550,610

(22) Filed: Nov. 21, 2014

(65) Prior Publication Data

US 2015/0077145 A1    Mar. 19, 2015

Related U.S. Application Data

(63) Continuation of application No. 13/486,450, filed on Jun. 1, 2012, now Pat. No. 8,896,330.

(60) Provisional application No. 61/519,915, filed on Jun. 1, 2011.

(51) Int. Cl.
   *G01R 27/16*    (2006.01)
   *H02J 3/38*    (2006.01)

(52) U.S. Cl.
   CPC .............. *G01R 27/16* (2013.01); *H02J 3/383* (2013.01); *H02J 2003/388* (2013.01); *Y02E 10/563* (2013.01); *Y10T 307/735* (2015.04)

(58) Field of Classification Search
   USPC .................... 324/707, 523, 527, 713, 602
   See application file for complete search history.

(56) References Cited

U.S. PATENT DOCUMENTS

| 4,658,365 | A | * | 4/1987 | Syrett | .................... | G01N 17/02 205/724 |
|---|---|---|---|---|---|---|
| 6,933,714 | B2 | | 8/2005 | Fasshauer et al. | | |
| 2002/0039299 | A1 | | 4/2002 | Nishimura et al. | | |
| 2002/0196025 | A1 | * | 12/2002 | Freeman | ................ | G01R 27/02 324/426 |

(Continued)

FOREIGN PATENT DOCUMENTS

| DE | 10006443 A1 | 10/2001 |
|---|---|---|
| DE | 10211206 A1 | 9/2003 |

(Continued)

OTHER PUBLICATIONS

Timbus et al., "Online Grid Measurement and ENS Detection for PV Inverter Running on Highly Inductive Grid", IEEE Power Electronics Letters, vol. 2, No. 3, Sep. 2004, pp. 77-82.

(Continued)

*Primary Examiner* — Vincent Q Nguyen
(74) *Attorney, Agent, or Firm* — Moser Taboada

(57) ABSTRACT

A method and apparatus for monitoring an AC line for impedance change. In one embodiment, the method, includes superimposing a tone on an AC current coupled to the AC line, wherein the tone is a higher frequency than an AC voltage waveform on the AC line; applying a correlation over a sampled AC voltage waveform, obtained by sampling the AC voltage waveform, to generate a correlated signal; and determining whether at least one change in characteristic of the correlated signal occurs.

18 Claims, 5 Drawing Sheets

(56) References Cited

U.S. PATENT DOCUMENTS

| | | | |
|---|---|---|---|
| 2003/0098671 A1 | 5/2003 | Hochgraf | |
| 2003/0164695 A1 | 9/2003 | Fasshauer et al. | |
| 2008/0278295 A1* | 11/2008 | McKenzie | H02J 13/0027 340/12.32 |
| 2011/0187200 A1 | 8/2011 | Yin et al. | |

FOREIGN PATENT DOCUMENTS

| | | |
|---|---|---|
| JP | 06343231 A | 12/1994 |
| JP | 08009650 | 1/1996 |
| JP | 2000308264 A | 11/2000 |
| JP | 2001251767 A | 9/2001 |
| JP | 2001258161 A | 9/2001 |
| JP | 2007288842 A | 11/2007 |
| JP | 2010213529 A | 9/2010 |
| SU | 1541532 A1 | 2/1990 |
| WO | WO-9610188 A1 | 4/1996 |

OTHER PUBLICATIONS

Asiminoaei et al., "Implementation and Test of On-line Embedded Grid Impedance Estimation for PV-Inverters", 35th Annual IEEE Power Electronics Specialists Conference, 2004, pp. 3095-3101.

Asiminoaei et al., "A Digital Controlled PV-Inverter With Grid Impedance Estimation for ENS Detection", IEEE Transactions on Power Electronics, vol. 20, No. 6, Nov. 2005, pp. 1480-1490.

Timbus et al., "Online Grid Impedance Measurement Suitable for Multiple PV Inverters Running in Parallel", IEEE, 2006, pp. 907-911.

Bertling et al., "A Novel Converter Integrable Impedance Measuring Method for Islanding Detection In Grids With Widespread Use of Decentral Generation", IEEE Speedam 2006 International Symposium on Power Electronics, Electrical Drives, Automation and Motion, 2006, 5 pgs.

Ciobotaru et al., "Online Grid Impedance Estimation for Single-Phase Grid-Connected Systems Using Pq Variations", IEEE, 2007, pp. 2306-2312.

Jou et al., "A Simplified Control Method for the Grid-Connected Inverter With the Function of Islanding Detection", IEEE Transactions on Power Electronics, vol. 23, No. 6, Nov. 2008, pp. 2775-2783.

Knop et al, "High Frequency Grid Impedance Analysis by Current Injection", IEEE, 2009, pp. 536-541.

Ciobotaru et al., "Accurate and Less-Disturbing Active Antiislanding Method Based on PLL for Grid-Connected Converters", IEEE Transactions on Power Electronics, vol. 25, No. 6, Jun. 2010, pp. 1576-1584.

International Search Report and Written Opinion dated Aug. 16, 2012 for PCT Application No. PCT/US2012/040229, 6 Pages.

Petrone et al., "Reliability Issues in Photovoltaic Power Processing Systems", IEEE Transactions on Industrial Electronics, IEEE Service Center, Piscataway, NJ, USA, vol. 55, Issue 7, pp. 2569-2580, Jul. 7, 2008.

Petrella et al., "Advances on Inter-Harmonic Variable-Frequency Injection-Based Grid-Impedance Estimation Methods Suitable for PV Inverters", IEEE Energy Conversion Congress and Exposition, 2009, Piscataway, NJ, USA, pp. 1173-1179, Sep. 20, 2009.

Pigazo et al., "Wavelet-Based Islanding Detection in Grid-Connected PV Systems", IEEE Transactions on Industrial Electronics, IEEE Service Center, Piscataway, NJ, USA, vol. 56, Issue 11, pp. 4445-4455, Nov. 1, 2009.

European Search Report dated Sep. 16, 2015 for European Application No. 12792459.5-1504.

* cited by examiner

METHOD AND APPARATUS FOR GRID IMPEDANCE DETECTION

CROSS-REFERENCE TO RELATED APPLICATIONS

This application is a continuation of co-pending U.S. patent application Ser. No. 13/486,450, filed Jun. 1, 2012, which claims benefit of U.S. provisional patent application Ser. No. 61/519,915, filed Jun. 1, 2011. Each of the aforementioned patent applications is herein incorporated in its entirety by reference.

BACKGROUND OF THE INVENTION

Field of the Invention

Embodiments of the present disclosure relate generally to anti-islanding of distributed power generation systems, and, in particular, to detecting a grid impedance change for anti-islanding.

Description of the Related Art

Solar panels, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load. One option to use the energy produced is to employ inverters to convert the DC current into an alternating current (AC) and couple the AC current to the commercial AC power grid. The power produced by such a distributed generation (DG) system can then be sold to the commercial power company.

Under some conditions, a grid-connected DG system may become disconnected from the utility grid, resulting in a potentially dangerous condition known as "islanding". During islanding, the utility cannot control voltage and frequency in the DG system island, creating the possibility of damage to customer equipment coupled to the island. Additionally, an island may create a hazard for utility line workers or the general public by causing a line to remain energized while it is assumed that the line has been disconnected from all energy sources. In order to mitigate the potential hazards of islanding, relevant standards require that inverters in a DG system detect the loss of the utility grid and shut down the inverter. As part of detecting an islanding condition, some standards may require that the inverter be able to detect an instantaneous impedance change on the grid within a certain time period, for example an instantaneous 1 ohm impedance change on the grid within 5 seconds. As such, all commercially available inverters must be equipped with such inverter-based anti-islanding capability.

Therefore, there is a need in the art for a method and apparatus for efficient detection of grid impedance changes by a grid-coupled inverter.

SUMMARY OF THE INVENTION

Embodiments of the present invention generally relate to a method and apparatus for monitoring an AC line for impedance changes. In one embodiment, the method comprises superimposing a tone on an AC current coupled to the AC line, wherein the tone is a higher frequency than an AC voltage waveform on the AC line; applying a correlation over a sampled AC voltage waveform, obtained by sampling the AC voltage waveform, to generate a correlated signal; and determining whether at least one change in characteristic of the correlated signal occurs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
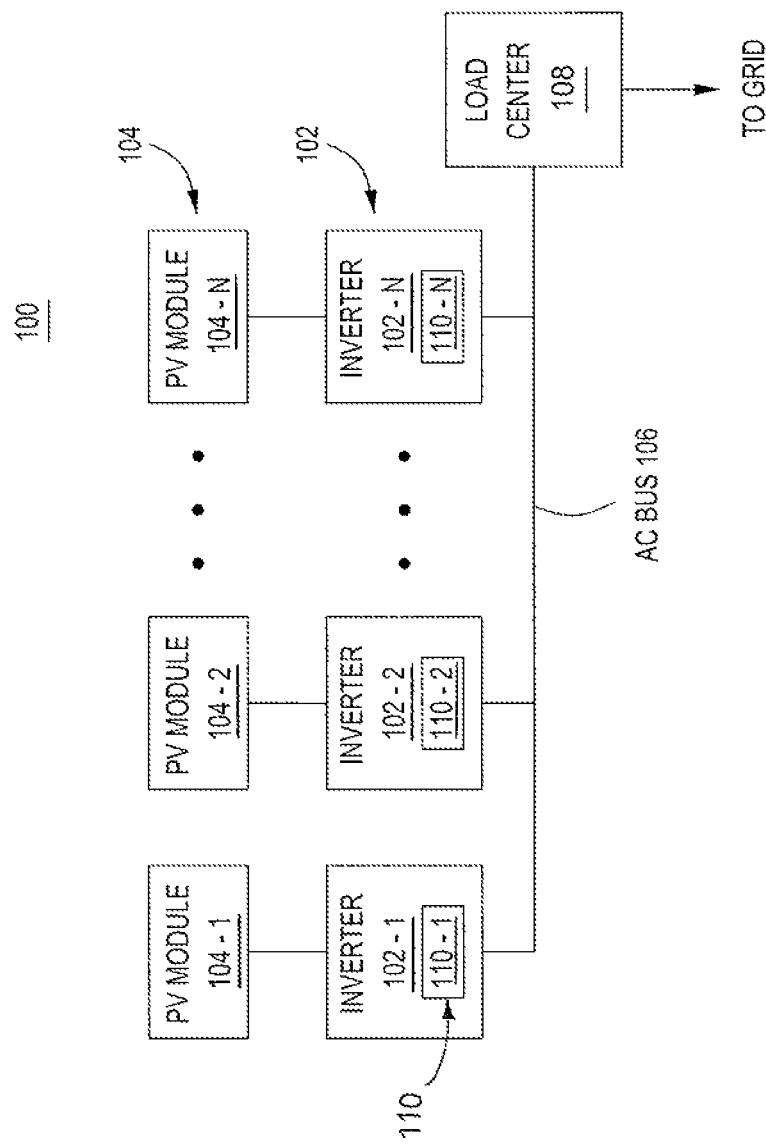
FIG. 1 is a block diagram of a system for distributed generation (DG) in accordance with one or more embodiments of the present invention.

FIG. 1 is a block diagram of a system 100 for distributed generation (DG) in accordance with one or more embodiments of the present invention. This diagram only portrays one variation of the myriad of possible system configurations. The present invention can function in a variety of distributed power generation environments and systems.

The system 100 comprises a plurality of inverters (i.e., power converters) 102-1, 102-2 . . . 102-N, collectively referred to as inverters 102, a plurality of PV modules 104-1, 104-2 . . . 104-N, collectively referred to as PV modules 104, an AC bus 106, and a load center 108.

Each inverter 102-1, 102-2 . . . 102-N is coupled to a PV module 104-1, 104-2 . . . 104-N, respectively, in a one-to-one correspondence. The inverters 102 are further coupled to the AC bus 106, which in turn is coupled to the load center 108. The load center 108 houses connections between incoming power lines from an AC commercial power grid distribution system (referred to as "the grid") and the AC bus 106. The inverters 102 convert DC power generated by the PV modules 104 into AC power, and meter out AC current that is in-phase with the AC commercial power grid voltage. The system 100 couples the generated AC power to the grid via the load center 108. Additionally, the generated AC power may be supplied directly to commercial and/or residential systems via the load center 108, and/or stored for later use (for example, the generated energy may be stored utilizing batteries, heated water, hydro pumping, $H_2O$-to-hydrogen conversion, or the like). In some alternative embodiments, multiple PV modules 104 may be coupled to a single inverter 102; for example, the PV modules 104 may be coupled to a single centralized inverter 102. In other embodiments, in addition to or instead of the PV modules 104, one or more other suitable sources of DC power may be coupled to the inverters 102; for example, any type of renewable energy source (e.g., a wind turbine, a hydroelectric system, or similar renewable energy source), batteries, or the like, may be coupled to the inverters 102 for providing DC input.

In accordance with one or more embodiments of the present invention, each of the inverters 102-1, 102-2 . . . 102-N comprises a grid impedance detection module 110-1, 110-2 . . . 110-N, respectively, for detecting a grid impedance change indicative of an islanding condition and controlling the inverter 102 accordingly. In order to detect such a grid impedance change, the grid impedance detection module 110 superimposes a high-frequency tone on the inverter's current output, applies a correlation at the specified frequency over the sampled AC voltage waveform, and monitors for a change in the correlation result, such as a change in at least one of amplitude, phase, real part, imaginary part, or combination thereof of the correlated signal, as described below.

In one or more alternative embodiments, the inverters 102 may additionally or alternatively receive power from other suitable DC sources, such as other renewable energy sources (e.g., wind farms, hydroelectric systems, or the like), batteries, and the like.

Figure 2:
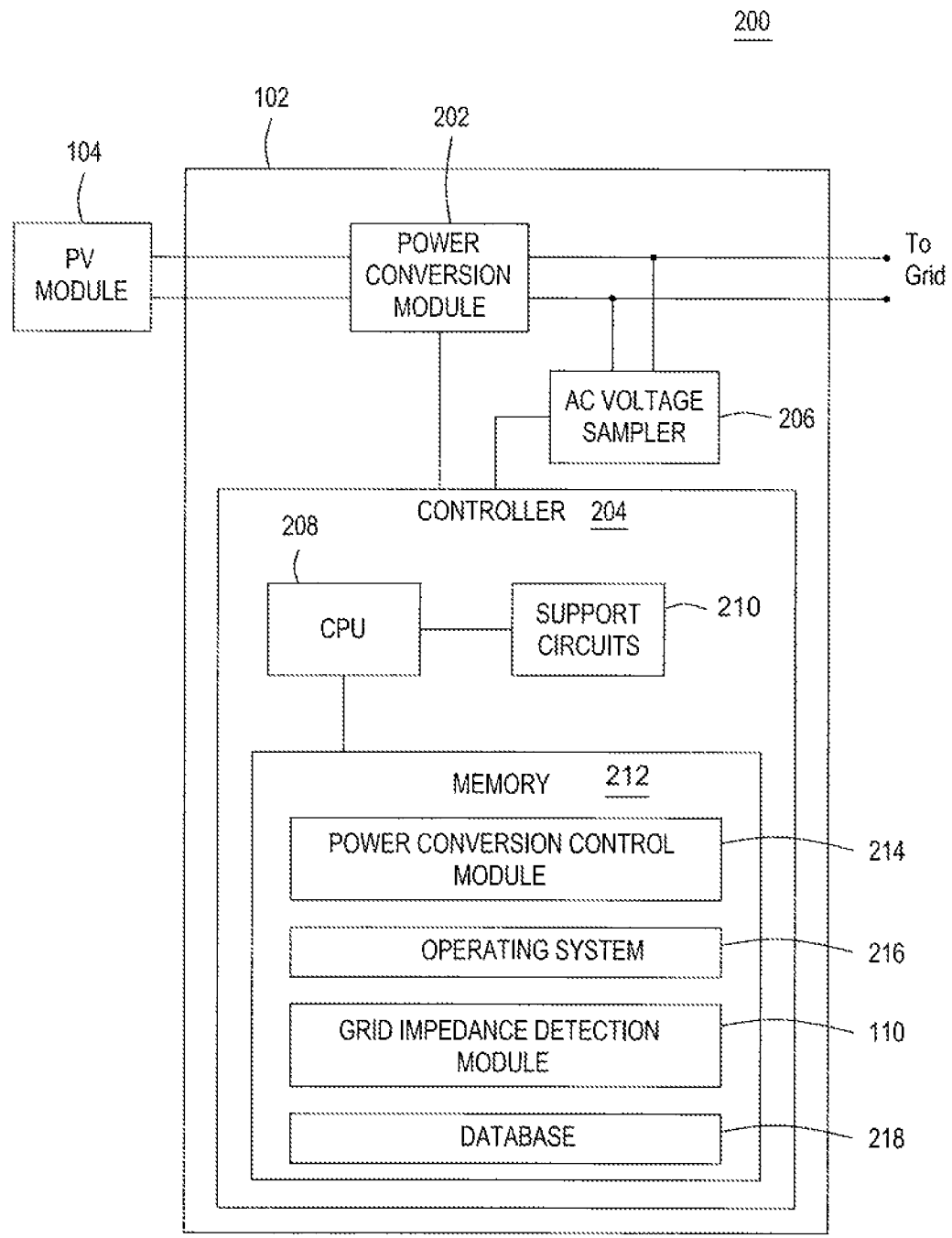
FIG. 2 is a block diagram of an inverter in accordance with one or more embodiments of the present invention.

FIG. 2 is a block diagram of an inverter 102 in accordance with one or more embodiments of the present invention. The inverter 102 comprises a power conversion module 202, a controller 204, and an AC voltage sampler 206.

The power conversion module 202 is coupled via two input terminals to the PV module 104, and via two output terminals to the commercial power grid. Additionally, the power conversion module 202 is coupled to the controller 204 and converts DC power from the PV module 104 to AC power in accordance with control and switching signals from the controller 204. The AC power produced is coupled to the commercial power grid such that it is in-phase with the AC grid voltage.

The AC voltage sampler 206 is coupled via two input terminals to the commercial power grid (i.e., at the output of the power conversion module 202) and via an output terminal to the controller 204, which is further coupled to the power conversion module 202.

The controller 204 comprises at least one central processing unit (CPU) 208, which is coupled to support circuits 210 and to a memory 212. The CPU 208 may comprise one or more conventionally available microprocessors. Alternatively, the CPU 208 may include one or more application specific integrated circuits (ASICs). In certain embodiments, the CPU 208 may be a microcontroller comprising internal memory for storing controller firmware that, when executed, provides controller functionality as described below, for example with respect to FIGS. 3 and 4.

The support circuits 210 are well known circuits used to promote functionality of the central processing unit. Such circuits include, but are not limited to, a cache, power supplies, clock circuits, buses, network cards, input/output (I/O) circuits, and the like. The controller 204 may be implemented using a general purpose computer that, when executing particular software, becomes a specific purpose computer for performing various embodiments of the present invention.

The memory 212 may comprise random access memory, read only memory, removable disk memory, flash memory, and various combinations of these types of memory. The memory 212 is sometimes referred to as main memory and may, in part, be used as cache memory or buffer memory. The memory 212 generally stores the operating system 216 of the controller 204. The operating system 216 may be one of a number of commercially available operating systems such as, but not limited to, Linux, Real-Time Operating System (RTOS), and the like.

The memory 212 may store various forms of application software, such as a power conversion control module 214 for controlling the operation of the power conversion module 202 (e.g., providing control and switching signals for DC-AC power conversion, shutting down the power conversion module 202 in response to a received deactivate signal, and the like), a grid impedance detection module 110 for performing one or more operations pertaining to the present invention, and a database 218 for storing data related to the operation of the power conversion module 202 and/or the present invention. In some embodiments, the power conversion control module 214, the grid impedance detection module 110, and the database 218, or portions thereof, may be implemented in any of software, firmware, hardware, or a combination thereof.

The AC voltage sampler 206 provides a means for sampling the AC grid voltage and provides such samples (i.e., signals indicative of the sampled voltage) to the controller 204. In some embodiments, the AC voltage sampler 206 samples the AC grid voltage at a rate of 30.72 kilohertz (kHz); alternatively, faster or slower sampling rates may be utilized. In some embodiments, the AC voltage sampler 206 comprises an analog-to-digital converter (ADC) for generating the samples in a digital format. The power conversion control module 214 utilizes the received AC grid voltage waveform information for operative control of the power conversion module 202.

In accordance with one or more embodiments of the present invention, the grid impedance detection module 110 detects changes in the grid impedance and operatively controls the power conversion module 202 accordingly. For example, the grid impedance detection module 110 may detect an instantaneous 1 ohm impedance change within 5 seconds and, as a result, deactivate power output from the power conversion module 202. The grid impedance detection module 110 superimposes a high frequency "tone" on the sinusoidal current output from the power conversion module 202 and monitors the corresponding perturbation caused to the AC grid voltage waveform by this tone. In some embodiments, the superimposed frequency is an Nth harmonic of the grid frequency, such as the eighth harmonic or the twelfth harmonic, although in other embodiments other frequencies may be used. In certain alternative embodiments, combinations of frequencies, or 0.5 harmonic, may be used for the tone.

The criteria for determining a frequency to be superimposed are mainly two-fold. There needs to be a band around zero in order to inject only a certain number of full cycles of the tone. The lower this frequency, the lower the relative number of cycles that can be injected. However, the higher this frequency, the more natural phase locked loop (PLL) jitter (from synchronizing to the grid, for example) can cause noise in the measurement. Therefore, a trade-off is made to optimize the Signal-to-Noise (SNR) ratio; in some embodiments, the superimposed frequency is the eighth harmonic of the grid frequency.

Generally, the amplitude of the superimposed frequency is selected to be high enough as to be above the noise floor of the AC voltage signal being correlated, but also low enough as to not induce negative going currents when the signal is superimposed. The AC noise floor may be determined empirically by analyzing correlation results when no tone is injected. The correlation results with tone injection should ideally be several times above the noise floor for good Signal-to-Noise Ratio (SNR). The amplitude of the superimposed frequency is generally normalized to rated inverter current; for example, superimposed tone amplitude may be about 4% of rated output current. In some embodiments, the amplitude of the superimposed frequency is 37 milliamp (mA) root mean square (RMS). Further, the signal is also not injected over the whole cycle of the AC grid voltage waveform (i.e., the signal is not injected over a fundamental period of the AC grid voltage waveform); in some embodiments, only 10 of the 12 full cycles of the high-frequency tone are injected per line cycle. Around the zero crossings of the AC grid voltage waveform, where the injected current is low, the tone is not superimposed but rather kept to zero, although in some alternative embodiments a lower amplitude tone may be injected here. Since only full cycles of the tone are injected, a gap of one full cycle is excluded around a zero-crossing. For example, the tone waveform may start at half of a (tone) cycle after a zero-crossing and finish at a half of a (tone) cycle before the next zero-crossing, then repeat. Although such injection is generally kept symmetric, in some embodiments it may be asymmetric.

The phase of the injected tone may be generally offset from the phase of the AC grid voltage waveform. A judicious selection of phase offset will effectively amplify the change in size of either the real part, imaginary part, amplitude, or phase of the correlation result during grid impedance transient events, enabling robust detection. For example, in some embodiments where the imaginary part of the correlation result is small, a small change in angle would lead to a large change in imaginary part. In such embodiments, the angle may be set to around 2 degrees to achieve this while ensuring that the angle wasn't so small that noise would trigger the trip falsely. Generally, the offset will be dependent on AC source impedance but alternatively may be tuned to the impedance specified in a relevant specification, such that in the inverter islanding detection test portion of specification VDE-0126-1-1. However, in certain embodiments, the phase of the injected tone may not be offset from the phase of the AC grid voltage waveform.

In order to detect a change in the grid impedance, the grid impedance detection module 110 applies a correlation at the specified tone frequency over the sampled AC voltage waveform. The grid impedance detection module 110 then monitors for a change in the correlation result, such as a change in one or more of amplitude, phase, real part, imaginary part, or combination thereof of the correlated signal. If the change over time is greater than a grid impedance threshold, the grid impedance detection module 110 "trips" the inverter 102 (i.e., causes the power conversion module 202 to cease power production), for example by a signal via the power conversion control module 214. In some embodiments, the correlation may utilize a pre-defined 'window' having a copy of the injected signal frequency (one AC cycle of positive tone and one AC cycle of negative tone). Each measured sample is multiplied by the corresponding correlation value. The result is a very high value (for example, a value greater than approximately 5% of measurable dynamic range) if the signal measured has components of the correlation, and zero or proximate zero (for example, less than 1% of measurable dynamic range) otherwise. The result is real and imaginary part of measured tone from which amplitude and phase may be determined.

In order to minimize potential false trips of the inverter 102 (for example, due to cycle-by-cycle disturbances, such as pre-existing distortion of the AC voltage waveform with harmonic components at the tone injection frequency, the phase of the injected tone is changed by 180 degrees every cycle of the grid voltage waveform. The resulting correlation is then performed over two cycles of the sampled grid voltage waveform, with the phase-shifted sequence on the second cycle, in order to cancel out any AC grid-induced waveform distortions and detect only the injected tone. Additionally, when the tone frequency is an Nth harmonic of the grid frequency (N=integer), and by switching the tone phase by 180° every cycle, the average superimposed frequency is two frequencies of (Nth harmonic of the grid frequency−fundamental of the grid frequency/2) and (Nth harmonic of the grid frequency+fundamental of the grid frequency/2), which are non-integer harmonics and thus are not counted in the harmonic distortion measurement. Such an Nth harmonic injection technique is immune to crossover distortion at zero crossing (due to not injecting tone over the whole cycle), is immune to pre-existing grid harmonics (as a result of the 180 degree phase reversal), and also will not disturb phase lock loop detection routines used to synchronize the inverter 102 to the grid (also due to not injecting tone over the whole cycle).

The grid impedance detection module 110 monitors the correlated signal; any change in any characteristic of the correlated signal (for example, one or more of magnitude, phase, real part, or imaginary part of the signal, or any combination thereof) can be used to detect a grid impedance change. In some embodiments, the change in the imaginary part is used when the tone is injected in phase with the current and so the phase of the signal is close to zero, meaning the imaginary part is close to zero. As such, any change in phase angle or amplitude of the signal will be immediately reflected by a large change in the imaginary part of the correlation result. In other embodiments, the change in phase angle is utilized for the measurement.

The correlated signal value is generally very noisy due to the amplitude of the voltage distortion being very small; for example, on the order of 20 millivolt (mV) peak on a 240 volt (V) waveform. In order to provide a more accurate result, the signal may be averaged over a period; in some embodiments, the signal may be averaged over a period on the order of 3 seconds. This averaged value is then put through a delay filter so that the latest averaged value can be compared against the delayed averaged value. If the difference between the averaged value and the delayed averaged value exceeds the grid impedance threshold, the inverter 102 is tripped and power production from the inventor 102 is ceased. The grid impedance threshold may be determined empirically, for example by observing the correlation result change during laboratory testing. In some embodiments for a 1 ohm grid impedance change test utilizing the eighth harmonic of the of the grid frequency, a threshold on the order of 20 degrees of phase shift may be utilized.

Figure 3:
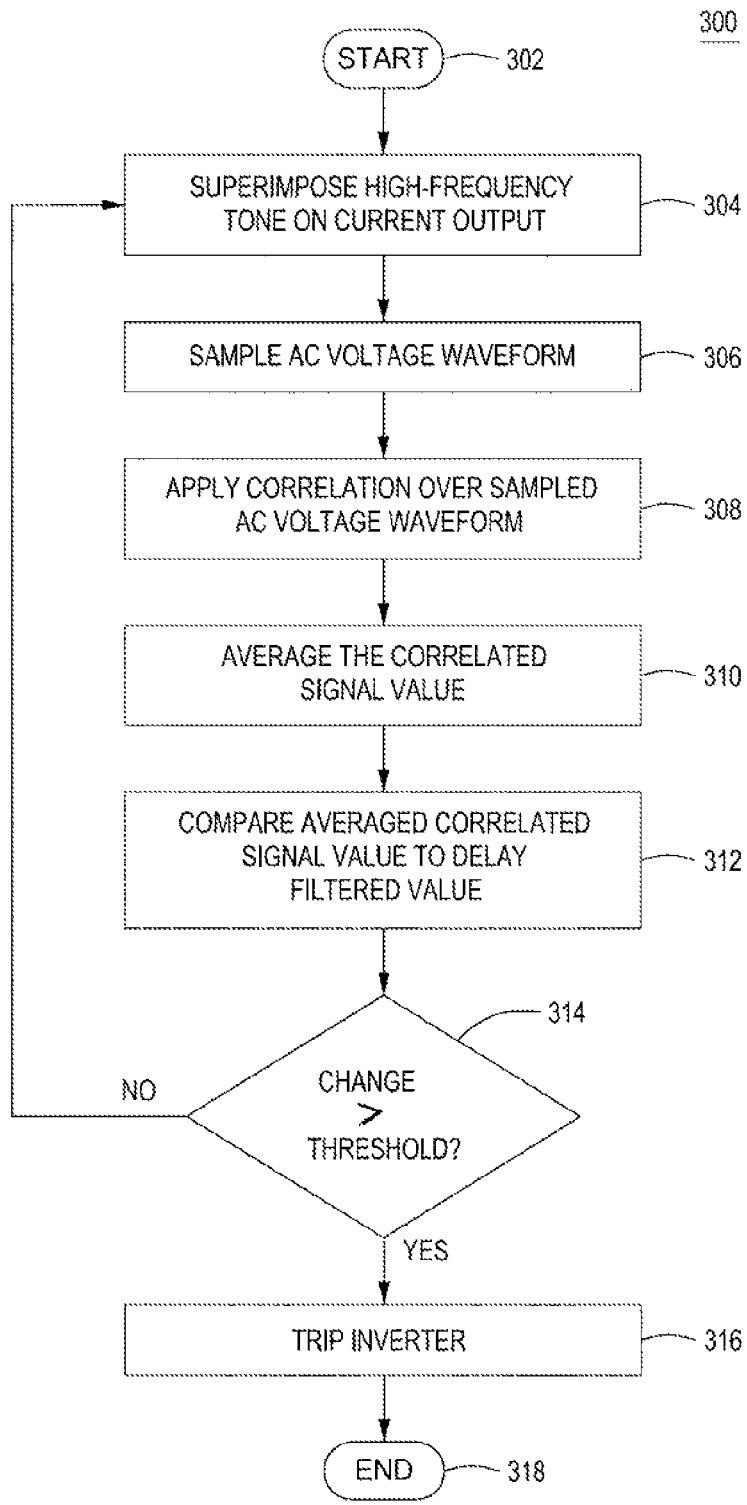
FIG. 3 is a flow diagram of a method for detecting a grid impedance change indicative of an islanding condition in accordance with one or more embodiments of the present invention.

FIG. 3 is a flow diagram of a method 300 for detecting a grid impedance change indicative of an islanding condition in accordance with one or more embodiments of the present invention. In some embodiments, such as the embodiment described below with respect to the method 300, an inverter is coupled to a PV module for converting DC power from the PV module to AC power (e.g., the inverter 102 coupled to the PV module 104). The inverter is further coupled to an AC commercial power grid and couples the generated AC power to the grid. In some alternative embodiments, the inverter may additionally or alternatively receive power from other suitable DC sources, such as other renewable energy sources (e.g., wind farms, hydroelectric systems, or the like), batteries, and the like.

The inverter comprises a grid impedance detection module (e.g., the grid impedance detection module 110) for detecting a change in the grid impedance and controlling the inverter accordingly.

The method 300 starts at step 302 and proceeds to step 304. At step 304, a high-frequency tone is superimposed on the current output from the inverter as previously described with respect to FIG. 2. At step 306, the AC grid voltage waveform is sampled, for example at a rate of 30.72 kilohertz (kHz). The method 300 proceeds to step 308, where a correlation is applied at the specified frequency (i.e., the frequency of the superimposed tone) over two cycles of the sampled AC voltage waveform with the inverse sequence on the second cycle. Although generally the correlation is applied over two cycles, in some alternative embodiments the correlation may be applied over a number of cycles that is a multiple of two. At step 310, the correlated signal value is averaged, for example over a period on the order of 3 seconds.

The method 300 proceeds to step 312. At step 312, for each of one or more characteristics of interest (i.e., one or more of amplitude, phase, real part, imaginary part, or a combination thereof) of the correlated signal, the averaged correlated signal value is compared to a delayed averaged correlated signal value (i.e., an earlier averaged correlated signal value that has been passed through a delay filter). For example, values for the current and previous average correlated signals may be compared by computing a difference between the values and comparing the difference to a grid impedance threshold. In some embodiments, for each of amplitude and phase, a difference between the current and previous average correlated signal values may be determined and compared to a corresponding grid impedance threshold. At step 314, a determination is made whether a change in one or more characteristics of the correlated signal (for example, a change in one or more of amplitude, phase, real part, or imaginary part of the signal, or a combination thereof) exceeds a corresponding grid impedance threshold. If the result of such determination is no, the method 300 returns to step 304. If, at step 314, the result of the determination is yes, the method 300 proceeds to step 316, where the inverter is 'tripped'—i.e., power output from the inverter is ceased. The method 300 then proceeds to step 318 where it ends.

Figure 4:
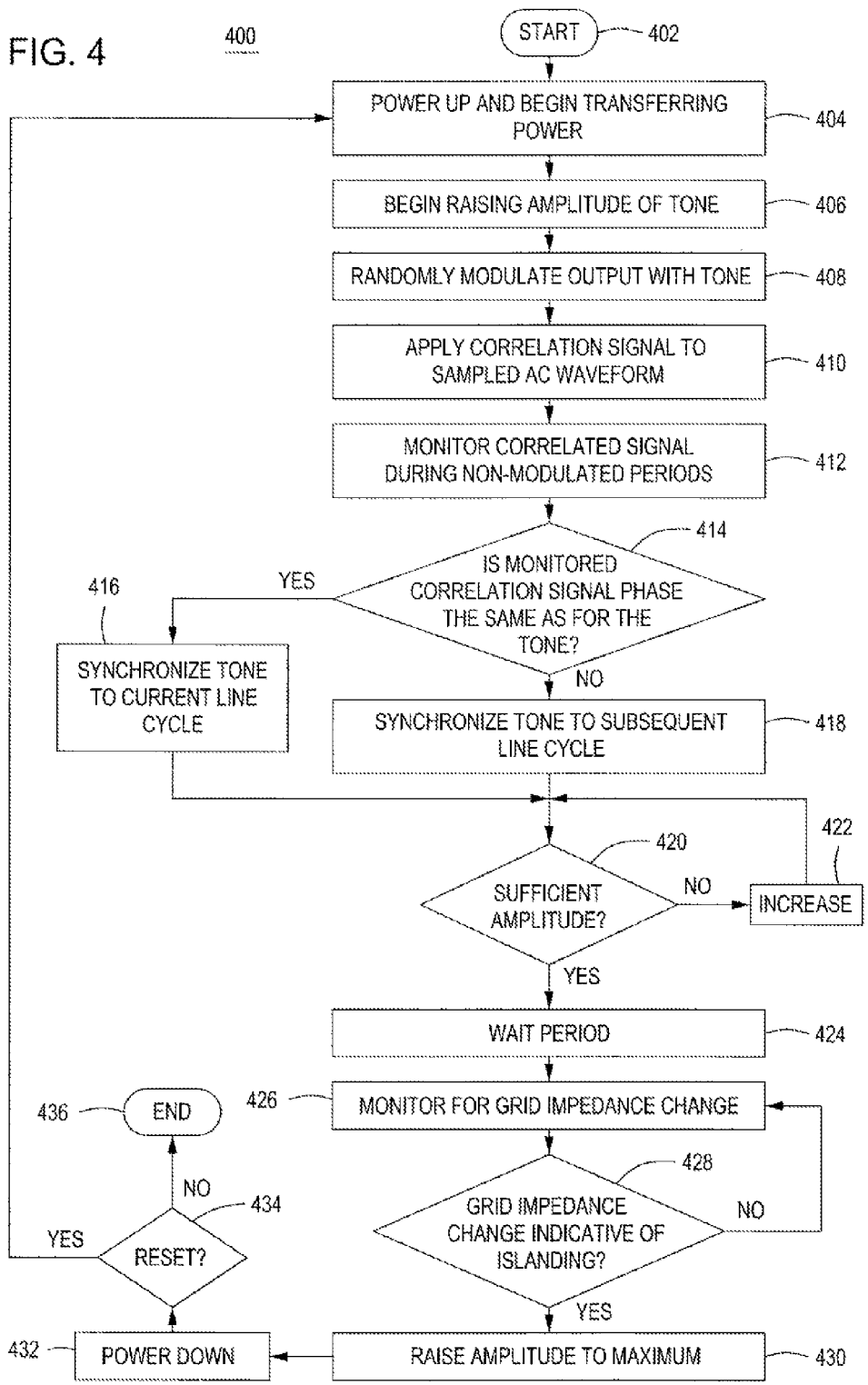
FIG. 4 is a flow diagram of a method for operating an inverter of a plurality of coupled inverters in accordance with one or more embodiments of the present invention.

FIG. 4 is a flow diagram of a method 400 for operating an inverter of a plurality of coupled inverters in accordance with one or more embodiments of the present invention. In some embodiments, such as the embodiment described below with respect to the method 400, a plurality of inverters are coupled to a plurality of PV modules in a one-to-one correspondence, where the inverter outputs are coupled to an AC bus and ultimately to an AC commercial power grid via a load center (e.g., the inverters 102, PV modules 104, AC bus 106, and load center 108). Each of the inverters comprises a grid impedance detection module (e.g., the grid impedance detection module 110) for detecting a grid impedance change indicative of an islanding condition and controlling the corresponding inverter accordingly, as previously described with respect to the FIGS. 2 and 3.

In some alternative embodiments, the inverter may additionally or alternatively receive power from other suitable DC sources, such as other renewable energy sources (e.g., wind farms, hydroelectric systems, or the like), batteries, and the like.

The method 400 begins at step 402 and proceeds to step 404, where an inverter powers up and begins transferring power to the grid (i.e., converting DC current from the corresponding PV module to AC current and coupling the AC current to the grid). Such powering up may occur, for example, after sunrise when sufficient light reaches the PV module, or following a reset of the inverter. At step 406, the inverter begins raising the amplitude of a high-frequency tone to be injected onto the output current; in some embodiments, the amplitude may be raised such that it reaches a maximum of 4% of the inverter rated output current over period of 20 seconds. At step 408, the inverter output is randomly modulated with the high-frequency tone (e.g., several cycles of the inverter output with the tone off, one cycle of the inverter output with the tone on, and the like).

The method 400 proceeds to step 410. At step 410, the inverter samples the AC grid waveform, for example at a rate of 30.72 kHz, and applies a correlation to the sampled AC waveform. During non-modulated periods, the inverter monitors the correlated signal at step 412. At step 414, a determination is made whether the monitored correlation signal phase is the same as the phase for the high-frequency tone. If the result of such determination is yes, the method 400 proceeds to step 416 where the high-frequency tone is synchronized to the current line cycle. If the result of the determination is no (i.e., the monitored correlation signal is of opposite phase to the tone signal), the method 400 proceeds to step 418 where the high-frequency tone is synchronized to the subsequent line cycle to match the prevailing output from any other operating inverters on the AC bus. When multiple inverters begin operating at the same time, the randomness of the signal injection (i.e., as in step 408) ensures that one phase will dominate and the remaining inverters will synchronize to the dominant phase. As a result of the injected harmonic sequence being phase reversed every other cycle, such synchronization among the inverters on a string is necessary to prevent their output signals from canceling each other out.

The method 400 proceeds from either step 416 or step 418 to step 420, where a determination is made whether the tone signal amplitude is high enough as to be above the noise floor of the AC voltage signal being correlated. If the result of such determination is no, the method 400 proceeds to step 422 where the amplitude is increased and the method 400 returns to step 420. If, at step 420, the result of the determination is yes, the method 400 proceeds to step 424. At step 424, a wait period (e.g., 5 seconds) is executed to allow the delay buffer to settle. The method 400 then proceeds to step 426, where the inverter monitors for a grid impedance change as previously described with respect to the method 300. At step 428, a determination is made whether a grid impedance change indicative of islanding has occurred. If the result of such determination is no, the method 400 returns to step 426 and monitoring continues. If, at step 428, the result of the determination is yes, the method 400 proceeds to step 430. At step 430, the amplitude of the high-frequency output is immediately raised to maximum, for example as limited by hardware constraints, to encourage the other inverters on the AC bus to trip simultaneously. In some embodiments, the maximum value may be held for a period on the order of 1 second to prevent some inverters from tripping immediately and thereby reducing the magnitude of the detected signal such that remaining inverters do not trip. Alternatively, rather than raising the high-frequency output to a maximum, the high-frequency output may be raised high enough to ensure that all other inverters see the signal change and trip off-line as well.

The method 400 proceeds to step 432 and the inverter powers down for a required off-time period. At step 434, a determination is made whether to reset the inverter. If the result of the determination is yes, the method 400 returns to step 404. If the result of the determination at step 434 is no, the method 400 proceeds to step 436 where it ends.

Figure 5:
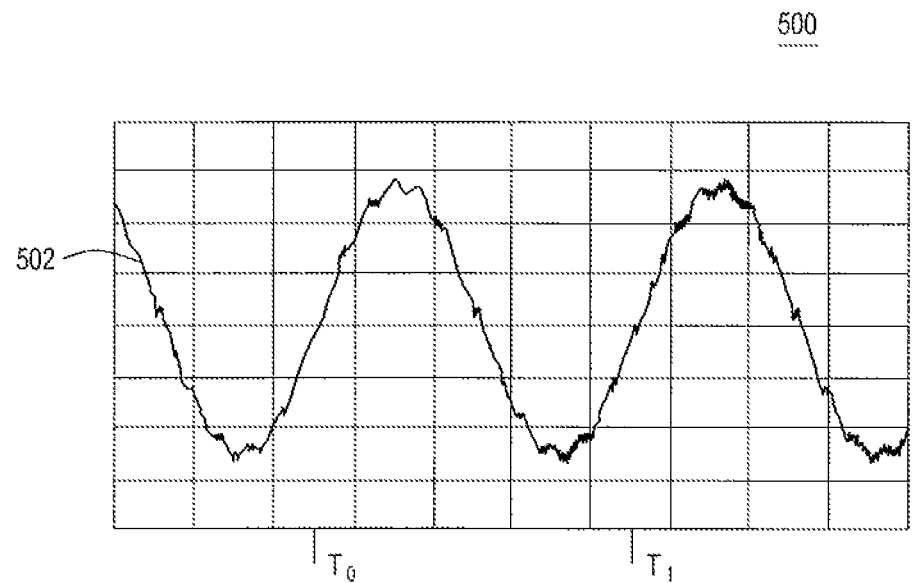
FIG. 5 is a graphical diagram of a modulated current waveform in accordance with one or more embodiments of the present invention.

FIG. 5 is a graphical diagram 500 of a modulated current waveform 502 in accordance with one or more embodiments of the present invention. The waveform 502 depicts the sinusoidal current output from an inverter that has been modulated by a high-frequency tone as previously described. In some embodiments, the AC commercial grid operates at 60 Hertz (Hz) and the time from T0 to T1 (i.e., a single cycle of the waveform 502) is 0.0167 seconds.

Figure 6:
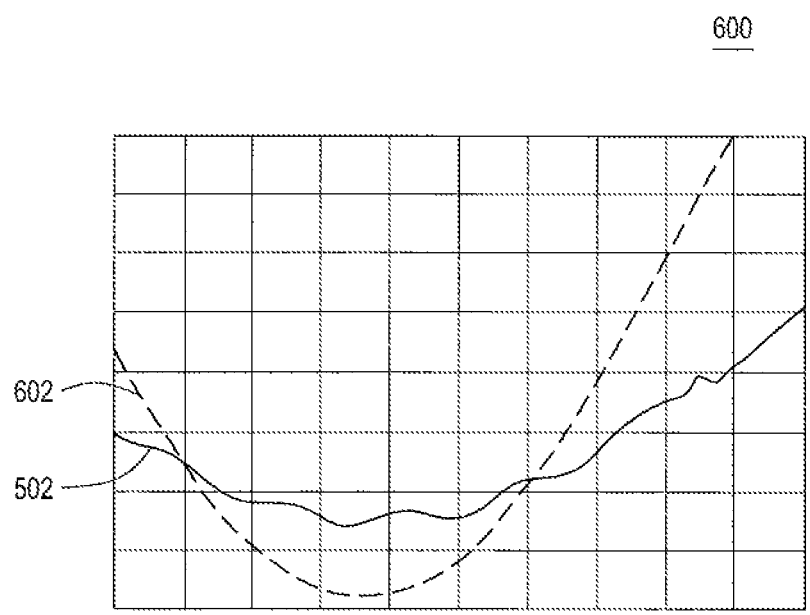
FIG. 6 is a graphical diagram of an exaggerated grid voltage waveform distortion resulting from the injected modulated current waveform in accordance with one or more embodiments of the present invention.

FIG. 6 is a graphical diagram 600 of an exaggerated grid voltage waveform distortion 602 resulting from the injected modulated current waveform 502 in accordance with one or more embodiments of the present invention. The graphical diagram 600 depicts a portion of the modulated current waveform 502 and an exaggerated version of the resulting AC voltage waveform distortion as waveform 602.

The foregoing description of embodiments of the invention comprises a number of elements, devices, circuits and/or assemblies that perform various functions as described. For example, a PV module is an example of a means for providing a DC input to a power converter, and the grid impedance detection module is an example of a means for superimposing a tone on an AC current coupled to the AC line, a means for applying a correlation over a sampled AC voltage to generate a correlated signal, and a means for determining whether at least one change in characteristic of the correlated signal occurs. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. A method of monitoring for a grid impedance change, comprising:
    superimposing a tone on an AC current injected onto an AC power grid, wherein the tone is superimposed on the AC current during a non-zero portion of an AC voltage waveform on the AC power grid;
    monitoring a perturbation to the AC voltage waveform, the perturbation caused by the superimposed tone, for a change in a characteristic; and
    identifying a change in impedance of the AC power grid based on the change in the characteristic, wherein the amplitude of the superimposed tone is (i) above the noise floor of the resulting perturbation of the AC voltage waveform, and (ii) below a level that induces negative-going currents when the tone is superimposed.

2. The method of claim 1, wherein the tone is a harmonic of the AC voltage waveform.

3. The method of claim 1, wherein an integer number of cycles of the tone are superimposed on the AC current during a period of the AC voltage waveform.

4. The method of claim 1, wherein the phase of the tone is changed by 180° every cycle of the AC voltage waveform.

5. The method of claim 1, wherein the change in the impedance is an instantaneous 1 ohm impedance change, and wherein the change in the impedance is identified within 5 seconds of occurring.

6. The method of claim 1, wherein the phase of the tone is offset from the phase of the AC voltage waveform.

7. An apparatus for monitoring for a grid impedance change, comprising:
    a grid impedance detection module that: (a) superimposes a tone on an AC current injected onto an AC power grid, wherein the tone is superimposed on the AC current during a non-zero portion of an AC voltage waveform on the AC power grid; (b) monitors a perturbation to the AC voltage waveform, the perturbation caused by the superimposed tone, for a change in a characteristic; and (c) identifies a change in impedance of the AC power grid based on the change in the characteristic, wherein the amplitude of the superimposed tone is (i) above the noise floor of the resulting perturbation of the AC voltage waveform, and (ii) below a level that induces negative-going currents when the tone is superimposed.

8. The apparatus of claim 7, wherein the tone is a harmonic of the AC voltage waveform.

9. The apparatus of claim 7, wherein an integer number of cycles of the tone are superimposed on the AC current during a period of the AC voltage waveform.

10. The apparatus of claim 7, wherein the phase of the tone is changed by 180° every cycle of the AC voltage waveform.

11. The apparatus of claim 7, wherein the change in the impedance is an instantaneous 1 ohm impedance change, and wherein the change in the impedance is identified within 5 seconds of occurring.

12. The apparatus of claim 7, wherein the phase of the tone is offset from the phase of the AC voltage waveform.

13. A system for monitoring for a grid impedance change, comprising:
    a photovoltaic (PV) module; and
    a power converter, coupled to the PV module and to an AC power grid, for generating an AC current that is injected onto the AC power grid, wherein the power converter comprises a grid impedance detection module that: (a) superimposes a tone on the AC current, wherein the tone is superimposed on the AC current during a non-zero portion of an AC voltage waveform on the AC power grid; (b) monitors a perturbation to the AC voltage waveform, the perturbation caused by the superimposed tone, for a change in a characteristic; and (c) identifies a change in impedance of the AC power grid based on the change in the characteristic.

14. The system of claim 13, wherein the tone is a harmonic of the AC voltage waveform.

15. The system of claim 13, wherein an integer number of cycles of the tone are superimposed on the AC current during a period of the AC voltage waveform.

16. The system of claim 13, wherein the phase of the tone is changed by 180° every cycle of the AC voltage waveform.

17. The system of claim 13, wherein the amplitude of the superimposed tone is (i) above the noise floor of the resulting perturbation of the AC voltage waveform, and (ii) below a level that induces negative-going currents when the tone is superimposed.

18. The system of claim 13, wherein the change in the impedance is an instantaneous 1 ohm impedance change, and wherein the change in the impedance is identified within 5 seconds of occurring.

* * * * *